(12) United States Patent
Hegenbart et al.

(10) Patent No.: US 12,128,605 B2
(45) Date of Patent: Oct. 29, 2024

(54) REINFORCING ELEMENT FOR A STRUCTURAL PROFILE, STRUCTURAL ARRANGEMENT, AIRCRAFT OR SPACECRAFT, AND METHOD FOR PRODUCING A STRUCTURAL ARRANGEMENT

(71) Applicant: Airbus Operations GmbH, Hamburg (DE)

(72) Inventors: Matthias Hegenbart, Hamburg (DE); Hermann Benthien, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 0 days.

(21) Appl. No.: 18/330,842

(22) Filed: Jun. 7, 2023

(65) Prior Publication Data

US 2023/0415404 A1 Dec. 28, 2023

(30) Foreign Application Priority Data

Jun. 22, 2022 (EP) .................................... 22180392

(51) Int. Cl.
*B64C 1/06* (2006.01)
*B29C 63/00* (2006.01)
(Continued)

(52) U.S. Cl.
CPC .......... *B29C 63/42* (2013.01); *B29C 63/0021* (2013.01); *B64C 1/06* (2013.01);
(Continued)

(58) Field of Classification Search
CPC .... B32B 1/08; B32B 3/06; F16L 53/34; F16L 3/12; F16B 7/0426; B64C 1/06; B64C 2001/0072; B29C 63/0021; B29C 63/42
See application file for complete search history.

(56) References Cited

U.S. PATENT DOCUMENTS 7,193,350 B1 * 3/2007 Blackburn ............. A61B 17/00
310/311
11,518,488 B2 12/2022 Benthien et al.
(Continued)

FOREIGN PATENT DOCUMENTS

DE 102008041230 A1 2/2010
DE 102018212442 A1 1/2020
(Continued)

OTHER PUBLICATIONS

European Search Report for corresponding European Patent Application No. 22180392 dated Nov. 30, 2022; priority document.

*Primary Examiner* — Tye William Abell
(74) *Attorney, Agent, or Firm* — Greer, Burns & Crain, Ltd.

(57) ABSTRACT

A reinforcing element for a structural profile, in particular for a round, oval or elliptical structural tube, includes a composite structure, which has a hollow-cylindrical, helically wound mesh of fiber strands which form an inner shell surface configured to receive the structural profile, wherein the fiber strands are respectively embedded in a matrix material, which has an electroactive polymer which can be stretched along a longitudinal extent of the fiber strands by application of an electrical voltage, such that the composite structure can be expanded by application of the electrical voltage to introduce the structural profile into the composite structure and can be shrunk by switching off the electrical voltage to fix the structural profile on the shell surface in the composite structure.

18 Claims, 5 Drawing Sheets

(51) Int. Cl.
*B29C 63/42* (2006.01)
*F16B 7/04* (2006.01)
*F16L 3/12* (2006.01)
*B64C 1/00* (2006.01)

(52) U.S. Cl.
CPC ............ *F16B 7/0426* (2013.01); *F16L 3/12* (2013.01); *B64C 2001/0072* (2013.01)

(56) References Cited

U.S. PATENT DOCUMENTS

| | | | |
|---|---|---|---|
| 2009/0085444 A1* | 4/2009 | Alvarez Icaza Rivera | ................. H10N 30/206 310/365 |
| 2013/0069630 A1* | 3/2013 | Manson | .................... G01L 9/08 428/34.4 |
| 2015/0280102 A1 | 10/2015 | Tajitsu et al. | |
| 2020/0122815 A1* | 4/2020 | Benthien | ................. B64C 1/068 |

FOREIGN PATENT DOCUMENTS

| | | |
|---|---|---|
| DE | 102018218039 A1 | 4/2020 |
| EP | 2539475 B1 | 9/2019 |
| WO | 2006121818 A2 | 11/2006 |

\* cited by examiner

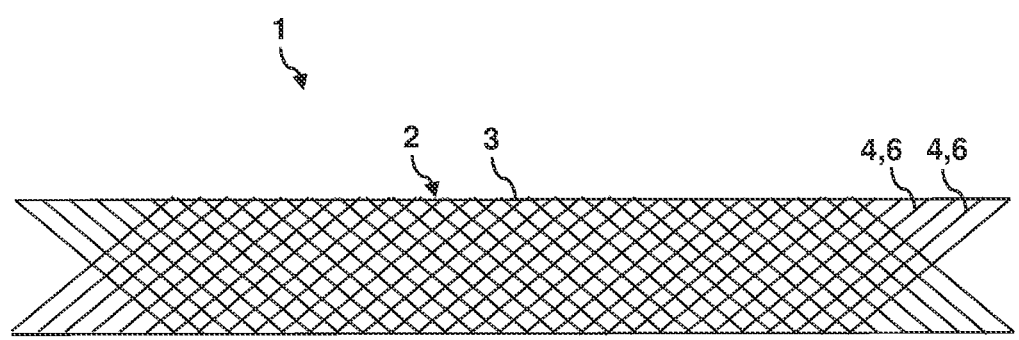
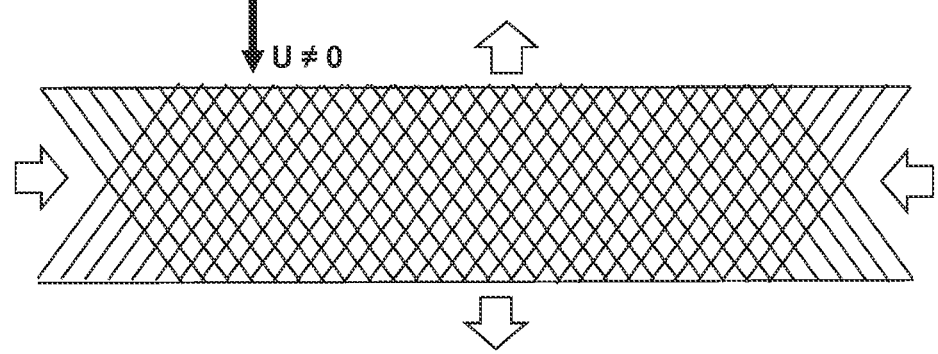
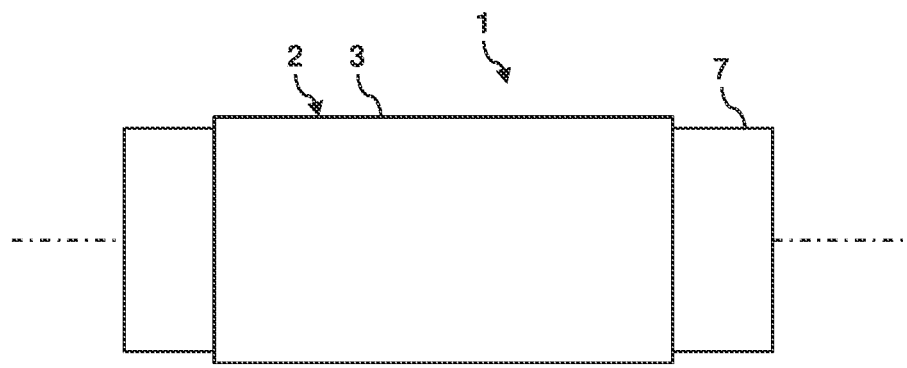

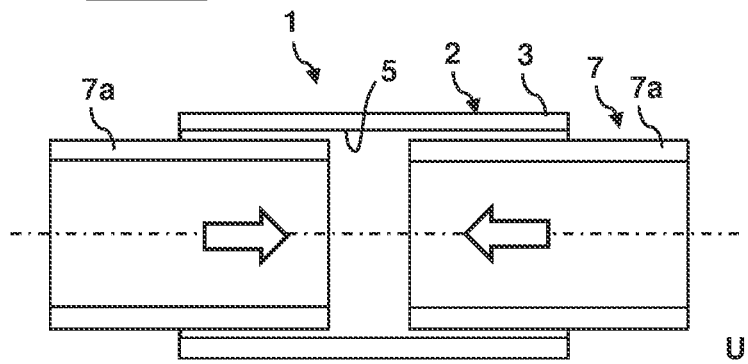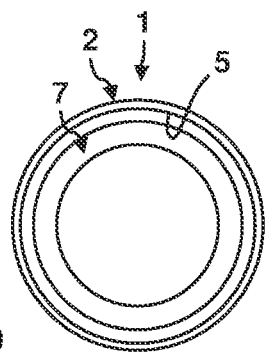
Fig. 3A  Fig. 3B
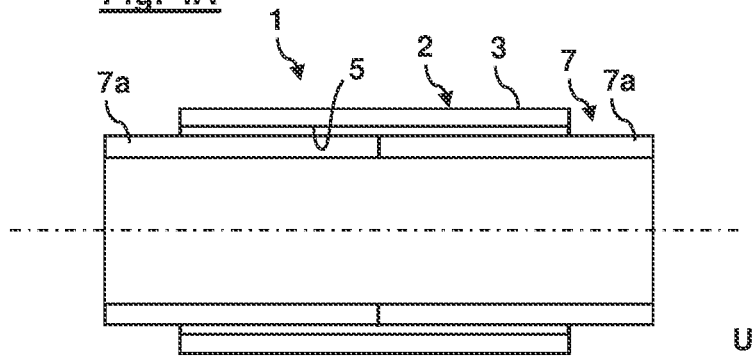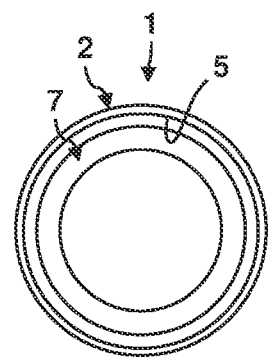
Fig. 4A  Fig. 4B
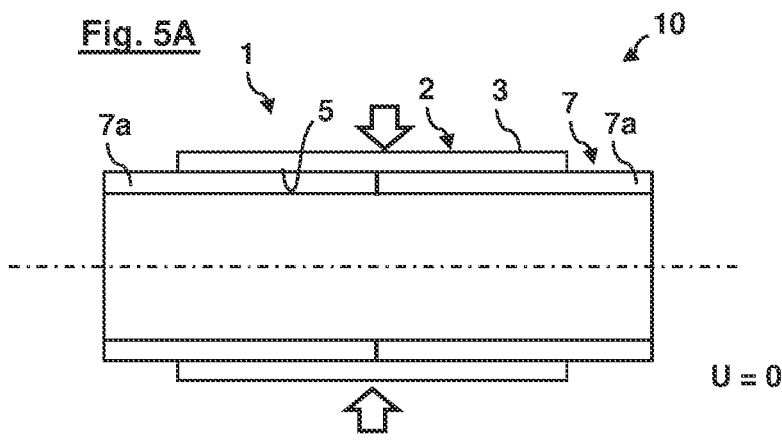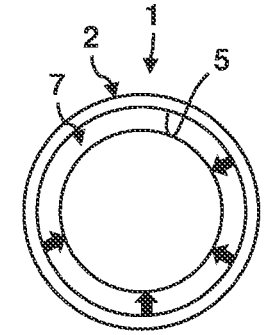
Fig. 5A  Fig. 5B

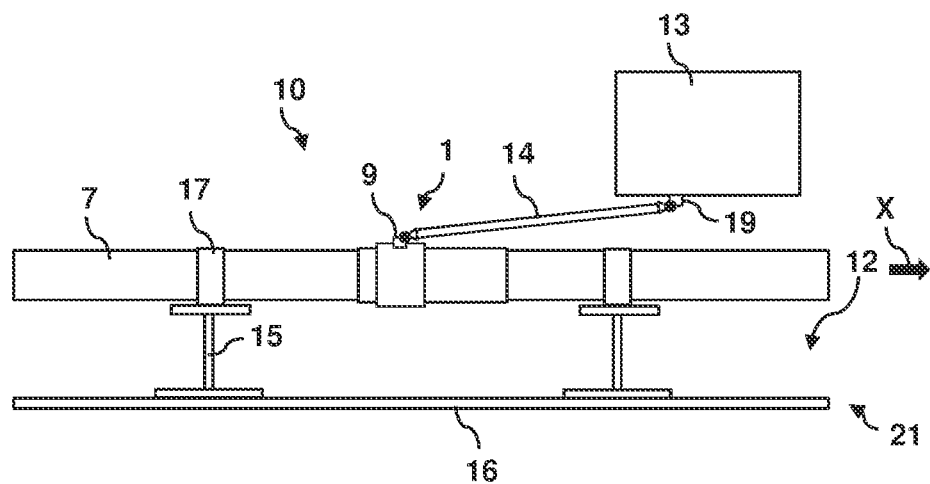
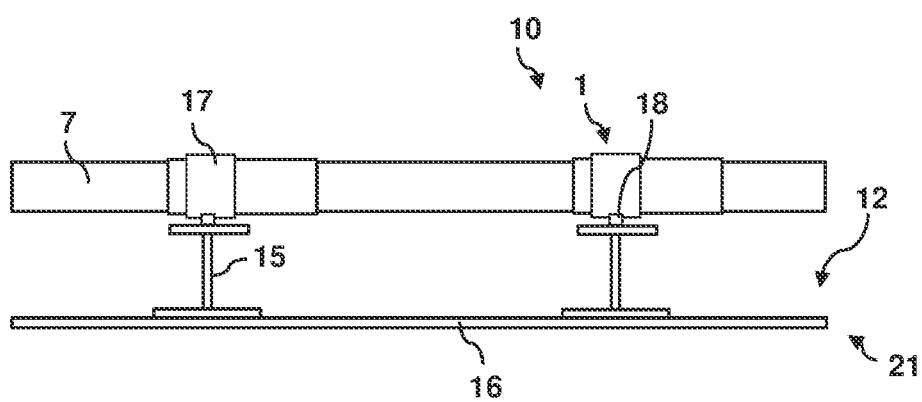

REINFORCING ELEMENT FOR A STRUCTURAL PROFILE, STRUCTURAL ARRANGEMENT, AIRCRAFT OR SPACECRAFT, AND METHOD FOR PRODUCING A STRUCTURAL ARRANGEMENT

CROSS-REFERENCES TO RELATED APPLICATIONS

This application claims the benefit of the European patent application No. 22180392.7 filed on Jun. 22, 2022, the entire disclosures of which are incorporated herein by way of reference.

FIELD OF THE INVENTION

The present invention relates to a reinforcing element for a structural profile, to a structural arrangement, in particular for an aircraft or spacecraft, with such a reinforcing element, to an aircraft or spacecraft with such a structural arrangement, and to a method for producing such a structural arrangement.

BACKGROUND OF THE INVENTION

In aeronautics, tubes are used as structural profiles for local absorbents of axial loads owing to their high resistance to bending. DE 10 2008 041 230 A1 describes attaching a line to a crosspiece, which is formed by a tube, by means of holders. Furthermore, the attaching of the tube to a fuselage cell structure by means of holders is described. For this purpose, the tube has a multiplicity of transverse bores which are introduced in a bore grid and are provided for form-fitting, axial securing of the holders. The holders have transverse webs with pins which correspond to the bores and are introduced into the bores in a form-fitting manner.

The document DE 10 2018 218 039 A1 describes a reinforcing element with a hollow-cylindrical, helically wound mesh of fiber strands which are respectively embedded in a thermoplastic matrix material which can be shrunk by heating in order to fasten the reinforcing element to a structural profile via an inner shell surface.

SUMMARY OF THE INVENTION

Against this background, the present invention is based on an object of creating a reinforcing element which permits a simplified connection to a structural profile, in particular to a tube.

According to the invention, a reinforcing element for a structural profile, in particular for a round, oval or elliptical structural tube, is provided. The reinforcing element comprises a composite structure, which has a hollow-cylindrical, helically wound mesh of fiber strands which form an inner shell surface designed to receive the structural profile, wherein the fiber strands are respectively embedded in a matrix material, which has an electroactive polymer which can be stretched along a longitudinal extent of the fiber strands by application of an electrical voltage such that the composite structure can be expanded by application of the electrical voltage in order to introduce the structural profile into the composite structure and can be shrunk by switching off the electrical voltage in order to fix the structural profile on the shell surface in the composite structure.

Furthermore, a structural arrangement, in particular for an aircraft or spacecraft, is provided. The structural arrangement comprises a structural profile, in particular a round, oval or elliptical structural tube, and a reinforcing element according to the invention which locally surrounds the structural profile, wherein the composite structure is shrunk for the application of a tensile stress and is thereby connected to the structural profile with a force fit.

Furthermore, an aircraft or spacecraft with a structural arrangement according to the invention is provided.

In addition, a method for producing a structural arrangement, in particular a structural arrangement according to the invention, is provided. The method comprises arranging an unshrunk reinforcing element according to the invention on a structural profile by application of an electrical voltage in such a manner that the inner shell surface locally surrounds the structural profile; performing tolerance compensation by displacing the reinforcing element along the structural profile into a final position; and switching off the electrical voltage in order to fasten the inner shell surface to the structural profile by shrinking the composite structure.

A concept on which the present invention is based is to use the functional principles of what are referred to as extension sleeves, also called finger traps, which taper under tensile load, for reinforcement or crash-safe introduction of load for structural profiles, in particular structural tubes, in the aircraft and spacecraft sector. This is based, inter alia, on the finding that the resistance of a profile, in particular a tube, to bending is increased by an external compressive force. Furthermore, on the basis of these active principles, portions of structural profiles or partial components can be connected to one another with a force fit, for example longitudinal portions of structural tubes (tube connections). Since, in the case of an extension sleeve, the internal pressure increases further because of the design as the load increases, a self-reinforcing connection or reinforcement is therefore present.

According to the invention, for this purpose, use is made of a helically wound mesh of fiber strands as a reinforcing element and/or connecting element, wherein the fiber strands are respectively embedded in an electroactive polymer as matrix material which expands along a fiber longitudinal extent by application of an electrical voltage. The reinforcing element is hollow in the center, thus creating a sleeve which is provided for pushing or threading onto a structural profile and which radially contracts in the event of a tensile load. The reinforcing element can be fastened here to a structural profile with a force fit or can be used for the force-fitting connection of two elements by first of all an electrical voltage being applied which expands the composite structure and thus makes the latter able to be positioned. As soon as the composite structure has arrived in the final installation position in which it at least locally surrounds the structural profile or the partial components to be connected, the voltage is switched off again. Cessation of the electrical voltage causes the composite structure to shrink back to its original extent. In the case of corresponding setting of the geometrical circumstances, a structural profile can therefore be reinforced on the basis of the pressure applied in such a way or profile components of a structural profile can be fastened to one another.

In one embodiment, the structural profile can also have a design which brings about a certain form-fitting fastening of the shrunk reinforcing element. For example, elevations can be provided regularly or irregularly or locally on the outer surface of the structural profile, around which surface the reinforcing element is placed during shrinking and thus engages behind it in the axial direction.

According to the invention, a two-stage force-fitting fastening can be achieved. On the one hand, the composite structure can be correspondingly configured to the effect that shrinking produces a peripheral pressure on the structural profile and therefore a force fit between the inner shell surface and the outer surface of the structural profile. As tensile loading increases, the pressure and therefore the force fit are additionally reinforced by the radial contraction of the mesh. In this way, the properties of the reinforcing element according to the invention can be adjusted in such a manner that an action which is advantageous in a plurality of respects for the connection of axial loads is achieved.

The structural profile can already be reinforced locally in respect of its resistance to bending by the pressure applied by the shrinking. In addition, a force fit which is sufficient for fastening a force introduction element, which is provided for axial loads, under normal loads, in particular flight loads, can be created. Upon occurrence of a tensile force which exceeds the normal level, in particular overloads which occur in the event of a crash, the composite structure can additionally apply with its mesh an additional very significant pressure as a result of the contraction of the fabric, which in a self-helping manner temporarily significantly increases, on the one hand, the resistance of the structural profile to bending and also temporarily massively reinforces the force fit. This enables a completely new configuration for the connection for absorbing axial loads on structural profiles.

As a result, structural profiles, in particular structural tubes, can have smaller or thinner dimensions because of the locally adjustable additional stiffening. Moreover, recesses, such as bores or the like, in the tubes are avoided according to the invention such that not only the rigidity but also the strength of the structure is improved. A significant reduction in weight can therefore be achieved overall. Unlike in the prior art, a temperature application is unnecessary since no thermoplastic matrix material has to be shrunk. On the contrary, suitable shrinking or expansion can be repeatedly realized by switching an electrical voltage on and off. The present connecting fit can therefore be repeatedly released. This makes the installation even more simple, more cost-effective and quicker than known solutions.

In addition, according to the invention, there is advantageously complete freedom in terms of positioning without preparation of the structural profile being necessary for this purpose. In particular, the unshrunk state of the reinforcing element can be used for simple, tolerance-compensating installation and free axial positioning of the reinforcing element. Measures for tolerance compensation, such as threaded sleeves or the like, during the installation are therefore superfluous. By skillful selection of the installation sequence and switching off of the electrical voltage only at the end of the installation when a final positioning of the components to be connected is produced, the fastening can still be produced optionally even in the event of poor accessibility of the connection points.

Furthermore, different materials in the composite structure can be combined with one another for different applications. For example, by supplementing the electroactive polymer with an elastomer (e.g., rubber), a sealing function can be realized: gaps within the mesh that may be present in an expanded state can be closed completely fluid-tightly in the event of suitable shrinkage because of the shrinkage effect. For example, tube portions can thus be coupled fluid-tightly to one another. It goes without saying in this respect that the matrix material can have further components and, in addition, different fiber materials can be used, e.g., carbon fibers, glass fibers, aramid fibers, Dyneema fibers, etc.

Although the invention affords particular advantages for round, oval or elliptical structural tubes, its use is not restricted thereto. On the contrary, it is also possible in principle for profiles shaped in some other way to be connected to one another or reinforced. However, owing to the fiber material used, it can be advantageous here if the supporting surface for the fiber material has a surface which is rounded to a greater or lesser extent, or at least no pointed edges are located under the fiber material.

Advantageous embodiments and developments will become apparent from the further dependent claims and from the description with reference to the figures.

According to one development, the fiber strands respectively together with the matrix material form material strips which are wound helically around the shell surface. The composite structure is therefore formed by a mesh of bands made from a material combination of fibers and electroactive polymer. In this development, the mesh, and therefore the composite structure, is particularly simple and cost-effective to produce.

According to one development, each fiber strand can be embedded individually in the matrix material. A composite thread is thereby formed with each fiber strand. A fiber strand can have a multiplicity of parallel fibers and/or a multiplicity of parallel fiber bundles. The mesh is correspondingly designed as a mesh of such composite threads. Accordingly, the composite threads form the hollow-cylindrical, helically wound mesh. In this manner, easy sliding of the composite threads on one another is advantageously made possible, and therefore the mesh can contract with little resistance or more easily. The sliding properties can furthermore be adjusted, for example, by downstream consolidation steps of differing intensity, and therefore an engagement threshold for the contracting action of the fabric can be predetermined.

According to one development, the structural profile can have two longitudinal portions. The reinforcing element can surround two mutually opposite ends of the respective longitudinal portions and thus connect the two longitudinal portions to each other. The reinforcing element can therefore also be used for connecting structural profile partial components, e.g., for tube connections of a structural tube.

According to one development, the reinforcing element can be designed and arranged for stiffening the structural profile. In particular, the reinforcing element can be provided for local bending stiffening. It is accordingly fitted in those regions at which buckling of the structural profile is to be expected in particular as a function of the prevailing Euler's case of the bearing of the structural profile. It would also be conceivable to provide the reinforcing element continuously between the bearing points of the structural profile and thus to continuously increase the bending rigidity.

According to one development, the reinforcing element can be designed and arranged for introducing axial loads into the structural profile. In this way, the pressure applied for the force fit can be used to support loads. Moreover, the axial loads can be applied as tensile load to the reinforcing element such that the mesh contracts above a predetermined tensile stress. In the case of a tensile load which lengthens the reinforcing element, the mesh can thus be used synergistically for additional temporary stiffening of the structural profile and for additional temporary reinforcing of the force fit.

According to one development, the reinforcing element can have a receptacle which is coupled to the composite structure and is designed to transmit axial loads to the composite structure. The receptacle, or at least parts of the receptacle, can be formed in one piece with the reinforcing element. However, it can also be a receptacle which can be attached retrospectively to the reinforcing element. The receptacle can be designed in multiple parts.

According to one development, the composite structure can be configured in such a manner that the mesh of fiber strands axially lengthens and radially contracts in the case of axial tensile loading such that the force fit with the structural profile is automatically reinforced. This is achieved, in particular, by the hollow-cylindrical, helically wound structure of the mesh. In particular, it is a biaxial mesh. Such a helical, biaxial mesh has no axial fiber strands whatsoever, therefore the entire tensile force is converted into an axial lengthening and radial contracting of the mesh.

According to one development of the aircraft or spacecraft, the structural profile can be designed as a structural tube which is attached to a primary structure of the aircraft or spacecraft and is intended for connecting at least one component to the primary structure.

According to one development of the aircraft or spacecraft, the structural profile, in particular a structural tube, can be arranged axially on a fuselage structure of the aircraft or spacecraft. In this way, axial loads of components, both conventional flight loads and also crash loads, can be supported on the structural profile. For example, galleys, on-board toilets or other cabin monuments are possible as such axially supportable components. A support which is easy to mount and compensates for tolerance, on the one hand, and also provides simple parallel line guidance and a high level of crash safety is therefore advantageously created.

According to one development, the at least one component can be connected to the structural tube via the reinforcing element. Alternatively or additionally, the structural tube can also be connected to the primary structure via the reinforcing element. The reinforcing element is thus suitable both for connection of the structural tube to a component or secondary structure to be connected and for connecting the structural tube to a primary structure, in particular an aircraft fuselage structure. The entire installation can therefore be advantageously planned in a simplified manner. In particular, all the tolerance-compensating working steps are superfluous.

In order to connect the component to the structural tube via the reinforcing element, the component is coupled in its installation situation to the reinforcing element and only subsequently is the reinforcing element connecting the component shrunk for fastening purposes (i.e., the applied electrical voltage is switched off and the composite structure thereby shrunk).

In order to connect the structural tube to the primary structure via the reinforcing element, the structural tube can be positioned in a simple manner at all of the fastening points and then the reinforcing elements connecting the structural tube is shrunk for fastening purposes. Of course, this is also possible in a stepwise manner, for example from rib to rib of a fuselage.

According to one development, the composite structure can be configured for dimensionally stable transmission of conventional flight loads by the force fit, which is applied with the shrinkage of the composite structure, to the structural tube. Accordingly, no deformation occurs either without extraordinary loads, and therefore the fabric does not yet contract or contracts merely reversibly under conventional loads, and the material does not deform or only deforms reversibly or elastically. Materials which ensure a high strength are therefore advantageous.

According to one development, the composite structure can be configured for shape-changing transmission of axial overloads to the structural profile by axial lengthening and radial contraction. Such overloads can be in particular crash loads. In this way, the reinforcing element contributes to a resistance of the connecting arrangement to bending in the event of an overload, in particular in the event of a crash, the resistance once again temporarily going significantly beyond the resistance to bending achieved originally by the shrinking, and also ensures secure fastening in this overload case as a result of a temporarily reinforced force fit.

According to one development of the method according to the invention, the reinforcing element can be designed for connecting a component to the structural profile, wherein performing the tolerance compensation comprises coupling the component to the reinforcing element and finally positioning the component in its installation position such that the component is attached in the installation position to the structural profile by shrinking of the composite structure of the reinforcing element. In this way, advantageously no additional operating step whatsoever is required for the purpose of tolerance compensation. On the contrary, tolerance compensation is automatically achieved as a result of a skillful change in the sequence of normal installation steps, which is made possible by the reinforcing element according to the invention.

The above embodiments and developments can be combined, where expedient, with one another as desired. Further possible embodiments, developments and implementations of the invention also comprise non-explicitly cited combinations of features of the invention described above or below in relation to the exemplary embodiments. In particular, a person skilled in the art will also add individual aspects as improvements or additions to the respective basic form of the present invention.

BRIEF DESCRIPTION OF THE DRAWINGS

The present invention will be explained in more detail below with reference to the exemplary embodiments indicated in the schematic figures. In the figures:

FIGS. 1A and 1B show a schematic view of a reinforcing element according to one embodiment of the invention with (1A) and without (1B) electrical voltage applied;

FIG. 2 shows a top view of the reinforcing element from FIGS. 1A and 1B which is attached to a structural profile;

FIGS. 3A, 3B, 4A, 4B, 5A and 5B show longitudinal and cross-sectional views of the reinforcing element and structural profile according to FIG. 2 during different installation steps;

FIG. 9 shows a top view of a structural arrangement according to a further embodiment of the invention;

FIG. 10 shows a top view of a structural arrangement according to yet another embodiment of the invention;

Figure 6:
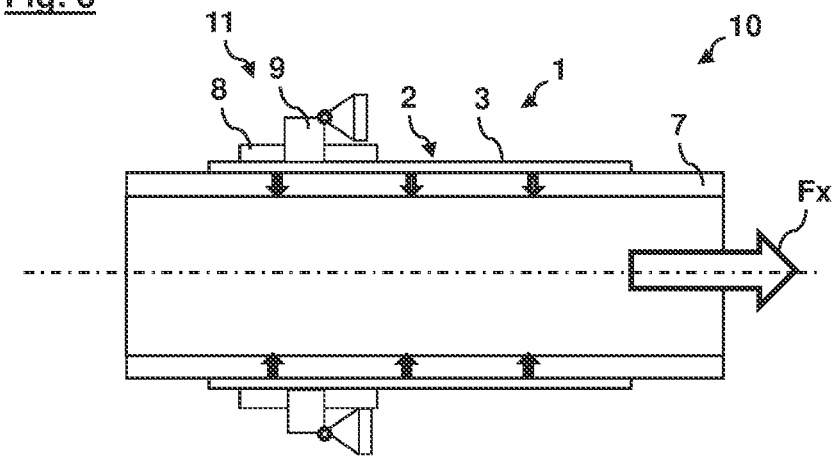
FIG. 6 shows a longitudinal sectional view of a structural arrangement according to one embodiment of the invention.

The appended figures are intended to impart further understanding of the embodiments of the invention. They illustrate embodiments and serve in conjunction with the description to explain principles and concepts of the invention. Other embodiments and many of the stated advantages arise in relation to the drawings. The elements of the drawings are not necessarily shown true-to-scale in relation to one another.

Elements, features and components which are identical, have the same function and act in the same manner are provided in each case with the same reference numbers in the figures of the drawing, unless indicated otherwise.

DETAILED DESCRIPTION OF THE PREFERRED EMBODIMENTS

FIGS. 1A and 1B show a schematic view of a reinforcing element 1 according to one embodiment of the invention with (FIG. 1A) and without (FIG. 1B) electrical voltage U applied. FIGS. 2 to 5 show the installation of the reinforcing element 1 on a structural profile 7.

The reinforcing element 1 is hollow-cylindrical and is provided for reinforcing the structural profile 7, for which purpose it is pushed thereon. The reinforcing element 1 is formed with a composite structure 2. The composite structure 2 contains a hollow-cylindrical, helically wound mesh 3 of fiber strands 4 which are respectively embedded in a matrix material 6. The composite structure 2 thus forms an inner shell surface 5 which is designed for receiving the structural profile 7.

In the embodiment illustrated, the fiber strands 4 are in each case formed together with the matrix material 6 as material strips which are wound helically around the shell surface 5. Each fiber strand 4 can be embedded individually in the matrix material 6. In this way, a multiplicity of composite threads are provided, wherein the mesh is designed as a mesh, which can be seen from the outside here, of such composite threads. Alternatively, a plurality of fiber strands can also be jointly embedded in a respective material strip of matrix material 6.

The matrix material 6 here comprises an electroactive polymer which is stretchable by application of an electrical voltage U along a longitudinal extent of the fiber strands 4, i.e., of the material strips. The matrix material 6 is designed in such a manner that the composite structure 2 can be expanded by application of the electrical voltage U in order to introduce the structural profile 7 into the composite structure 2 (at FIG. 1B) and can be shrunk by switching off of the electrical voltage U (FIG. 1A) in order to fix the structural profile 7 on the shell surface 5 in the composite structure 2 by applying a circumferential tensile force during the shrinkage.

FIGS. 3A to 5B show an exemplary installation sequence to illustrate these functional principles. As can be gathered from FIGS. 3A to 5B in this respect, the structural profile 7 is, for example, a round tube. Of course, other profile cross sections are possible in further embodiments. Furthermore, it can be gathered from these figures that the structural profile 7 can have, for example, two longitudinal portions 7a which are connected to one another via the reinforcing element 1. However, it goes without saying that the reinforcing element 1 is also attachable to a single-part structural tube.

In FIGS. 3A and 3B, a voltage is applied to the matrix material 6 and, owing to this actuation of the electroactive polymer, the composite structure 2 is in the extended (expanded) state in which the structural profile 7 can be pushed between the shell surface 5. In this case, the two longitudinal portions 7a are pushed for this purpose from one side in each case, and therefore the reinforcing element 1 surrounds two opposite ends of the respective longitudinal portions 7a.

In the unshrunk state illustrated here, the reinforcing element 1 is applied with predetermined play to the structural profile 7 such that it surrounds the structural profile 7 and is displaceable in the axial direction. A spacing or a clearance fit is correspondingly provided at least in sections between the inner shell surface 5 of the composite structure 2 and an outer surface of the structural profile 7, this ensuring simple displaceability. The concentric arrangement illustrated here with a comparatively large intermediate space between the structural profile 7 and the adjustment element 1 should be understood as being purely illustrative. A play can in actual fact also be provided to be comparatively small. In particular, it can be a clearance fit which, however, also permits simple displaceability of the reinforcing element along the structural profile 7.

In FIGS. 4A and 4B, this operation is finished and the two longitudinal portions 7a lie against each other inside the shell surface 5. In FIGS. 5A and 5B, the applied electrical voltage U is now switched off, which leads to shrinkage of the composite structure 2 (cf. arrows). The components 1, 7 can be configured here in such a manner that this generates a peripheral tensile force and a superficial pressure around the entire structural profile 7 (as symbolized by the arrows indicated at the inner shell surface 5).

The uniform pressure on the structural profile 7 leads on the one hand to a force fit between the reinforcing element 1 and structural profile 7 such that the reinforcing element 1 is fastened to the structural profile 7 by shrinkage and forms a structural arrangement 10 therewith. In addition, the peripherally applied pressure increases the resistance of the structural profile 7 to bending. At the same time, a connecting fit between the two longitudinal portions 7a of the structural profile 7 is created.

A structural arrangement 10 of this type can be used, for example, for an aircraft or spacecraft to support X loads, i.e., loads acting in the flight direction. A structural profile 7 can be formed in a different manner depending on the structure of such an aircraft or spacecraft. Of course, this can be a metal profile, but it would also be conceivable to provide a fiber composite profile.

The embodiment illustrated is a hollow profile cross section. The structural profile is accordingly a tube. Profile cross sections of this type advantageously have high resistance to bending, which is advantageous in particular for a targeted load support. In further embodiments, however, a solid structural profile 7 would also be conceivable.

The structural profile 7 is locally surrounded by the reinforcing element 1, as is described with respect to the figures. The composite structure 2 of the reinforcing element 1 is shrunk for the application of a tensile stress. In this way, a force fit is produced between the reinforcing element 1 and the structural profile 7 and a local peripheral pressure is applied to the structural profile 7.

In the embodiment illustrated, the reinforcing element 1 is designed and arranged for local bending stiffening of the structural profile 7. The structural arrangement 10 correspondingly has an increased resistance to bending in the region of the reinforcing element 1 as a result of the applied pressure.

FIG. 6 shows a longitudinal sectional view of a structural arrangement 10 according to a further embodiment.

In addition to the bending stiffening effect, the reinforcing element 1 is also designed here for the introduction of axial loads into the structural profile 7. For this purpose, the reinforcing element 1 has a receptacle 11 which is coupled to the composite structure 2 and is designed for transmitting axial loads, which are symbolized here by an arrow Fx, to the composite structure 2.

The receptacle 11 firstly comprises a clamp 8 which engages around the composite structure 2 in the region of a longitudinal side end of the composite structure 2. The clamp 8 is preferably an uninterrupted sleeve-like clamp 8. In further embodiments, however, it would also be conceivable to provide an interrupted clamp 8 upon which, in particular, a prestress acts.

The clamp 8 is peripherally connected to the composite structure 2. For this purpose, both form-fitting and integrally bonded connections are conceivable.

For example, the receptacle 11 can be couplable or coupled to the composite structure 2 in an integrally bonded manner via the matrix material 6. For example, the clamp 8 is formed integrated with the reinforcing element 1, it also being possible for shrinkable or expandable materials to be used for the clamp. For this purpose, in the case of a fabric 3 embedded jointly in the matrix material 6, the clamp can already be embedded during production. Otherwise, the clamp 8 can be connected retrospectively to the matrix material.

The clamp 8 has one or more force introduction elements 9. The embodiment illustrated involves two oppositely arranged articulation points which in each case allow a bearing with at least one rotational degree of freedom. This can involve in particular a bolt bearing. Dual axis bearings or ball joint bearings are, however, also conceivable. In this way, the transmission of torques to the structural profile 7 is avoided and therefore the targeted support of axial loads, symbolized here by an arrow Fx, is ensured via the force introduction element 9.

If a tensile force Fx is applied to the connecting element 1 via such a force introduction element 9, this is initially transmitted to the structural profile 7 via the shrunk composite structure 2. The reinforcing element 1 is preferably configured in such a manner that the customary operating loads can be transmitted in this way, in particular flight loads in the case of an aircraft or spacecraft. The composite structure 2 is correspondingly configured for dimensionally stable transmission of conventional flight loads by the force fit, which is applied with the shrinkage, to the structural tube.

However, if excessive loads occur, for example in the event of a crash, the particular functionality of the mesh 3 comes into effect. The composite structure 2 is configured in such a manner that, in the case of excessive axial tensile loading Fx, the mesh 3 of fiber strands 4 axially lengthens and radially contracts such that an additional pressure is applied to the structural profile and the force fit to the structural profile 7 is automatically reinforced. The composite structure 2 is correspondingly configured for shape-changing transmission of axial overloads Fx, in particular crash loads, to the structural profile by axial lengthening and radial contraction.

For this purpose, for example, the mesh 3 is designed as a biaxial, helical mesh made from material strips, with it being possible for there not to be any fibers or strips in the x direction, which, in particular, represents the flight direction. Such a mesh 3 is able to lengthen in the event of a tensile force and at the same time reduce its diameter or radially contract. A configuration is possible here which allows this mechanism to come into effect at a predetermined tensile force threshold, in particular only in the event of an excessive load.

The pressure which additionally acts on the structural profile 7 in the case of engagement of an excessive tensile force Fx is illustrated here with further arrows engaging on the inner shell surface 5. In this way, on the one hand, the fastening by a force fit is strengthened and furthermore the local resistance of the structural profile 7 to bending is once again additionally increased. This thus involves a self-helping design and a configuration of the reinforcing element since it is capable of automatically increasing the holding forces and also the stiffening forces under higher loading.

Figure 7:
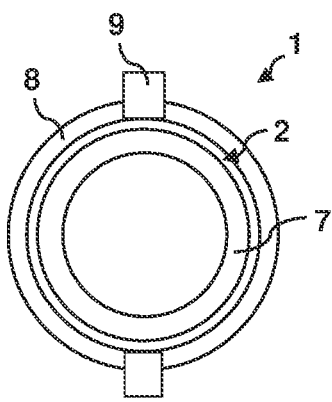
FIG. 7 shows a cross-sectional view of the structural arrangement according to FIG. 6.

FIG. 7 shows a cross-sectional view of the structural arrangement 10 according to FIG. 6.

It can be seen that the clamp 8 here is formed peripherally. The force introduction elements 19 are received at two opposite points in a recess of the clamp 8, for example in a form-fitting manner. In further embodiments, an integral formation of the force introduction elements 9 with the clamp 8 would also be conceivable. In particular, the force introduction elements 9 can also be provided partially embedded in the clamp 8.

Figure 8:
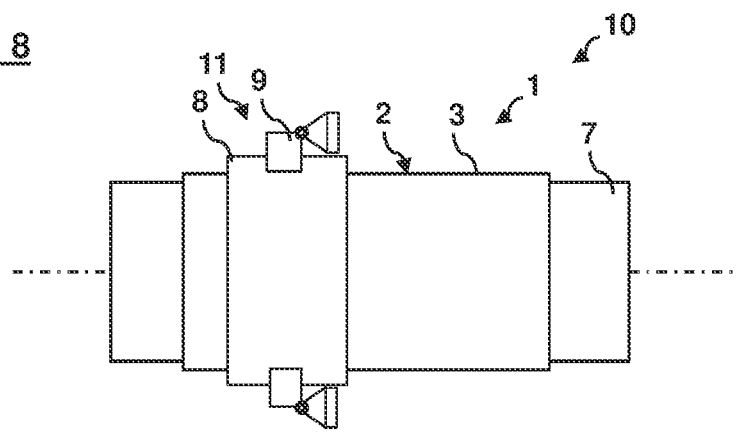
FIG. 8 shows a top view of the structural arrangement according to FIGS. 6 and 7.

FIG. 8 shows a top view of the structural arrangement 10 according to FIGS. 6 and 7.

In this view, the peripheral formation of the clamp 8 can be seen once again. Furthermore, the helically wound structure of the fabric 3 of the composite structure 2 is apparent from FIG. 6 and in FIG. 1.

FIG. 9 shows a top view of a structural arrangement 10 according to a further embodiment.

The structural profile 7 is designed here as a structural tube connected to a primary structure 12 of an aircraft or spacecraft. The structural tube is designed for connecting a component 13 to the primary structure 12 to support it in flight direction X.

The primary structure 12 is illustrated here merely schematically and has, purely by way of example, a plurality of ribs 15 and a skin 16 of a fuselage 21 of an aircraft or spacecraft 20. The structural tube runs in flight direction X and is arranged axially on the fuselage 21. The structural tube is connected here in each case to the ribs 15, for example by means of tube clamps 17.

The structural tube together with a reinforcing element 1 forms a structural arrangement 10 as is described essentially with respect to FIGS. 6 to 8. A Samer rod 14 is coupled at one end to at least one force introduction element 9 of the reinforcing element 1 and is coupled at its other end to the component 13 via a force transmission element 19. In this way, the component 13 is connected to the structural tube via the reinforcing element 1 and thus provides an axial support in the X direction for the component 13.

Such a component 13 can be, for example, a cabin element which is supported in this manner in flight direction X. For example, a galley, an on-board toilet or another cabin monument can be provided as the component 13.

Figure 12:
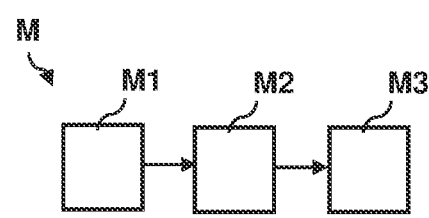
FIG. 12 shows a schematic flow diagram of a method for producing a structural arrangement according to one embodiment of the invention.

Particularly simple installation of components 13 of this type can be realized particularly advantageously in this way. A method for producing a structural arrangement 10 of this type can be gathered from FIG. 12 in the form of a flow diagram. The method M comprises, under M1, arranging an unshrunk reinforcing element 1 on the structural profile 7 with application of an electrical voltage U in such a manner that the inner shell surface 5 locally surrounds the structural profile 7. The method M comprises, under M2, furthermore performing tolerance compensation by displacing the reinforcing element 1 along the structural profile 7 into a final position. The method M comprises, under M3, furthermore switching off the electrical voltage U in order to fasten the inner shell surface 5 to the structural profile 7 by shrinking the composite structure 2.

In order to connect the component 13 to the structural profile 7, the performing of the tolerance compensation comprises coupling the component 13 to the reinforcing element 1 and finally positioning the component 13 in its installation position. For this purpose, the reinforcing element can be axially freely displaced. The component 13 can subsequently be connected to the structural profile 7 by shrinking the composite structure 2 of the reinforcing element 1 in the installation position. Advantageously, in this way, no additional tolerance-compensating measures, such as floating bearings or the like, are necessary.

FIG. 10 shows a top view of a structural arrangement 10 according to yet another embodiment.

In this embodiment, a reinforcing element 1 is likewise provided, wherein the latter is provided here for connecting the structural tube to the primary structure 12. Instead of the articulated force introduction elements 9, sockets 18 which are fastened to the ribs 15 and are fastened with the clamp 8 are provided here. In the unshrunk state, the structural tube pushed into the reinforcing elements 1 can be axially freely displaced therein.

The method for producing the structural arrangement 10 runs here substantially identically to that described with respect to FIG. 9, with the difference that the structural profile is freely movable relative to the reinforcing element for tolerance compensation. Tolerances, in particular manufacturing tolerances of the primary structure 12, can therefore be compensated for here by the reinforcing element 1. After final positioning, the structural tube can then subsequently be fastened by switching off the electrical voltage U. For example, axial manufacturing tolerances of an aircraft fuselage can therefore be easily compensated for without additional measures.

Of course, this type of connection of the structural tube can be combined with the connection of a component 13 according to FIG. 9. For this purpose, an additional reinforcing element 1 can be provided or optionally also a reinforcing element 1, which is present in any case for the connection to the primary structure 12, can be provided with additional force introduction elements.

Figure 11:
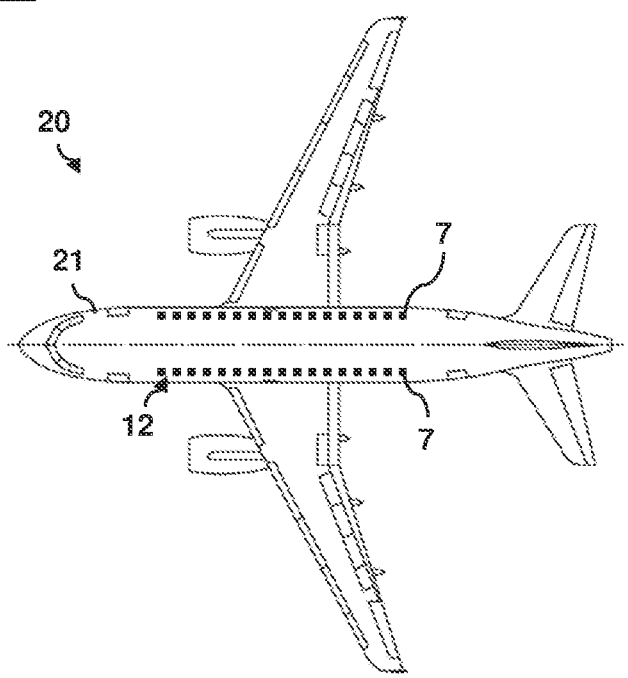
FIG. 11 shows a top view of an aircraft or spacecraft.

FIG. 11 shows a top view of an aircraft or spacecraft 20.

The aircraft or spacecraft 20 has a fuselage 21 which has the primary structure 12 described with respect to FIGS. 9 and 10. The structural profile 7 is indicated merely schematically by dashed lines to illustrate the axial profile, the structural profile being connected to the primary structure 12. The connection to the primary structure 12 can be designed in particular according to FIG. 10. The structural profile 7 is provided for supporting cabin elements, such as galleys, on-board toilets or other cabin monuments, is provided in the form of components 13 in the axial direction X and is designed as a structural tube reinforced by the reinforcing element 1.

In the preceding detailed description, various features for improving the stringency of the illustration have been combined in one or more examples. However, it should be clear here that the above description is merely illustrative, and does not have a restricted nature in any way. It serves to cover all the alternatives, modifications and equivalents of the various features and exemplary embodiments. Many other examples will be clear immediately and directly to a person skilled in the art on the basis of their specialist knowledge in view of the above description.

The exemplary embodiments have been selected and described in order to be able to present the principles underlying the invention and their application possibilities in practice as well as possible. As a result, specialist personnel can modify and use the invention and its various exemplary embodiments in an optimum way with respect to the intended purpose of use. In the claims and the description, the terms "including" and "having" are used as neutral terms for the corresponding term "comprising".

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS

1 Reinforcing element
2 Composite structure
3 Mesh
4 Fiber strand
5 Inner shell surface
6 Matrix material
7 Structural profile
7a Longitudinal portion
8 Clamp
9 Force introduction element
10 Structural arrangement
11 Receptacle
12 Primary structure
13 Component
14 Samer rod
15 Rib
16 Skin
17 Tube clamp
18 Socket
19 Force transmission element
20 Aircraft or spacecraft
21 Fuselage
U Electrical voltage
X Aircraft X direction
M Method
M1-M3 Method steps

The invention claimed is:

1. A reinforcing element for a structural profile, comprising:
a composite structure, which has a hollow-cylindrical, helically wound mesh of fiber strands which form an inner shell surface configured to receive the structural profile, wherein the fiber strands are respectively embedded in a matrix material, which has an electroactive polymer which is configured to be stretched along a longitudinal extent of the fiber strands by application of an electrical voltage such that the composite structure expands by application of the electrical voltage in order to introduce the structural profile into the composite structure and shrink by switching off the electrical voltage in order to fix the structural profile on the shell surface in the composite structure.

2. The reinforcing element as claimed in claim 1, wherein the fiber strands respectively together with the matrix material form material strips which are wound helically around the shell surface.

3. A structural arrangement, comprising:
a structural profile; and
a reinforcing element as claimed in claim 1 which locally surrounds the structural profile,
wherein the composite structure is shrunk from an unshrunk state for the application of a tensile stress and is thereby connected to the structural profile with a force fit.

4. The structural arrangement as claimed in claim 3, wherein the structural profile comprises a round, oval or elliptical structural tube.

5. The structural arrangement as claimed in claim 3, wherein the structural profile has two longitudinal portions, wherein the reinforcing element surrounds two mutually opposite ends of the respective longitudinal portions and thus connects the two longitudinal portions to each other.

6. The structural arrangement as claimed in claim 3, wherein the reinforcing element has a receptacle which is coupled to the composite structure and is configured to transmit axial loads to the composite structure.

7. The structural arrangement as claimed in claim 3, wherein the composite structure is configured such that the mesh of fiber strands axially lengthens and radially contracts during axial tensile loading such that the force fit to the structural profile is automatically reinforced.

8. The structural arrangement as claimed in claim 3, wherein the reinforcing element is configured and arranged to stiffen the structural profile.

9. The structural arrangement as claimed in claim 8, wherein the reinforcing element is configured and arranged to provide local bending stiffening.

10. The structural arrangement as claimed in claim 8, wherein the reinforcing element is configured and arranged to introduce axial loads into the structural profile.

11. An aircraft or spacecraft with a structural arrangement as claimed in claim 3.

12. The aircraft or spacecraft as claimed in claim 11, wherein the composite structure is configured for shape-changing transmission of axial overloads, to the structural profile by axial lengthening and radial contraction.

13. The aircraft or spacecraft as claimed in claim 11, wherein the structural profile is configured as a structural tube which is connected to a primary structure of the aircraft or spacecraft and is configured to connect at least one component to the primary structure.

14. The aircraft or spacecraft as claimed in claim 13, wherein the structural tube is arranged axially on a fuselage structure of the aircraft or spacecraft.

15. The aircraft or spacecraft as claimed in claim 13, wherein at least one of:
the at least one component is connected to the structural tube via the reinforcing element, or
the structural tube is connected to the primary structure via the reinforcing element.

16. The aircraft or spacecraft as claimed in claim 13, wherein the composite structure is configured for dimensionally stable transmission of conventional flight loads by the force fit, applied with the shrinking of the composite structure, to the structural tube.

17. A method for producing a structural arrangement as claimed in claim 3, comprising:
arranging the shrunk reinforcing element in the unshrunk state on a structural profile by application of an electrical voltage in such a manner that the inner shell surface locally surrounds the structural profile;
performing tolerance compensation by displacing the reinforcing element along the structural profile into a final position; and
switching off the electrical voltage to fasten the inner shell surface to the structural profile by shrinking the composite structure.

18. The method as claimed in claim 17, wherein the reinforcing element is configured to connect a component to the structural profile, wherein performing the tolerance compensation comprises coupling the component to the reinforcing element and finally positioning the component in its installation position such that the component is connected to the structural profile by shrinking the composite structure of the reinforcing element in the installation position.

* * * * *